(12) United States Patent
Vester et al.

(10) Patent No.: US 6,351,124 B1
(45) Date of Patent: Feb. 26, 2002

(54) ANTENNA SYSTEM FOR THE RECEPTION OF MAGNETIC RESONANCE SIGNALS

(75) Inventors: Markus Vester, Nurenberg; Ludwig Kreischer, Dormitz; Jianmin Wang; Wolfgang Renz, both of Erlangen, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/576,764

(22) Filed: May 24, 2000

(30) Foreign Application Priority Data

Jun. 23, 1999 (DE) .......................................... 199 28 452

(51) Int. Cl.[7] ................................................. G01V 3/00
(52) U.S. Cl. ...................................... 324/318; 324/322
(58) Field of Search ................................ 324/318, 322, 324/300, 306, 307, 309; 600/421, 422; 455/276

(56) References Cited

U.S. PATENT DOCUMENTS

| | | | |
|---|---|---|---|
| 4,232,399 A | * 11/1980 | Heiter | ........................ 455/276 |
| 4,721,913 A | 1/1988 | Hyde et al. | .................. 324/318 |
| 4,816,765 A | 3/1989 | Boskamp | ..................... 324/318 |
| 4,833,429 A | * 5/1989 | Kerten et al. | ................ 324/318 |
| 5,132,621 A | * 7/1992 | Kang et al. | .................. 324/322 |
| 5,471,142 A | 11/1995 | Wang | ........................... 324/318 |

OTHER PUBLICATIONS

"Fast Recovery with a Conventional Probe," Hoult, J. of Mag. Res., vol. 57 (1984), pp. 394–403.

"Floating Surface Coil," Tanttu, Conference vol. XIV ICMBE and IV ICMP, Espoo, Finland, 1985, p. 831.

* cited by examiner

*Primary Examiner*—Louis Arana
(74) *Attorney, Agent, or Firm*—Schiff Hardin & Waite

(57) ABSTRACT

An antenna system for the reception of magnetic resonance signals has at least two resonant individual antennas. The individual antennas are connected to a pre-amplifier via a combination circuit. The combination circuit is fashioned such that signal contributions that can be emitted by the individual antennas exhibit a phase difference of 0° or 180° at the pre-amplifier.

10 Claims, 3 Drawing Sheets

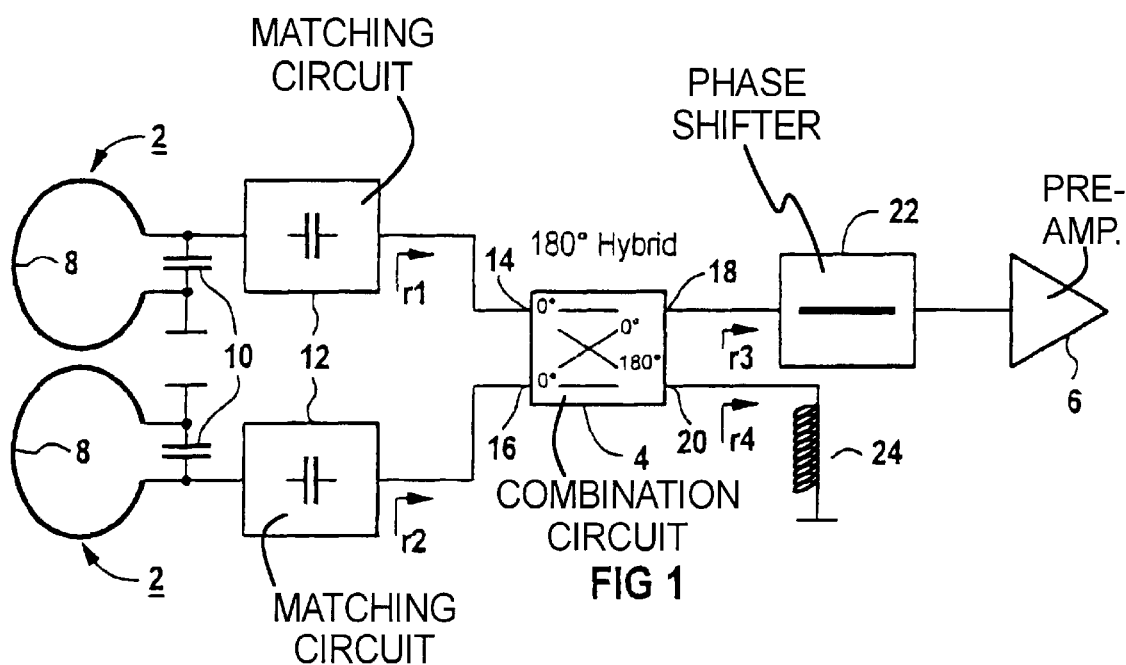
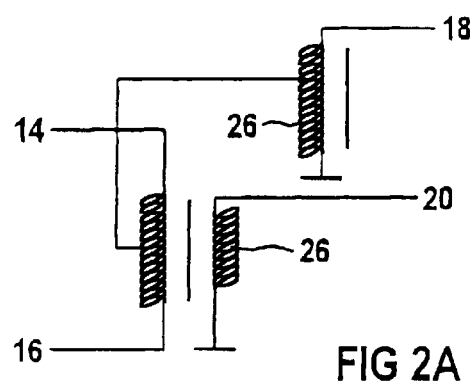
FIG 1
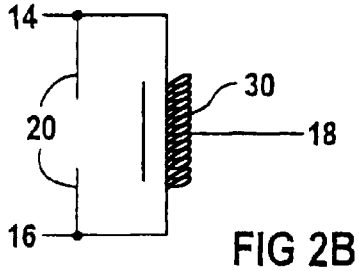
FIG 2A
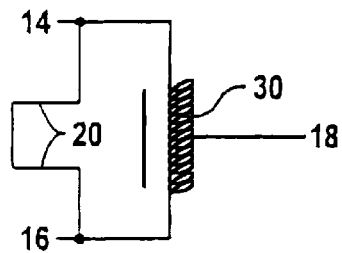
FIG 2B
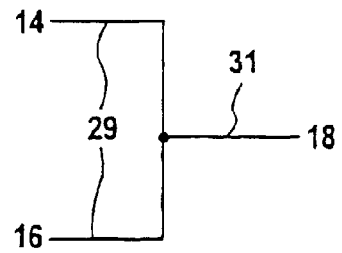
FIG 2C
FIG 2D

ANTENNA SYSTEM FOR THE RECEPTION OF MAGNETIC RESONANCE SIGNALS

BACKGROUND OF THE INVENTION

1. Field of the Invention

The present invention is directed to an antenna system for the reception of magnetic resonance signals with at least two resonant, individual antennas.

2. Description of the Prior Art

U.S. Pat. No. 5,471,142 discloses an antenna system of the above general type. The antenna system has a number of resonant individual antennas. Each individual antenna is connected to a pre-amplifier via a matching circuit. The signal path composed of the individual antenna, matching circuit and pre-amplifier is dimensioned such that the input impedance of the pre-amplifier attenuates the individual antenna. It is advantageous that the signal contributions of the individual antennas to the sum signal can be differently weighted. This, however, is at the expense of a high electronics outlay.

U.S. Pat. No. 4,721,913 discloses an antenna system that has two conductor loops arranged side-by-side in one plane, these being electrically connected in parallel and forming a single resonant circuit with a shared resonance capacitor. Magnetic transmission fields that are aligned perpendicular to the plane, however, induce currents in this arrangement that in turn distort the transmission field. Further, the signal contributions of the two conductor loops in the sum signal cannot be varied.

The antenna system disclosed in U.S. Pat. No. 4,816,765 has two series-connected conductor loops (butterfly antenna) and a single resonance capacitor, so that the two conductor loops form one resonant circuit. As in the antenna system disclosed in U.S. Pat. No. 4,721,913, the signal contributions of the two conductor loops in the sum signal cannot be varied.

The article by D. I. Hoult, "Fast Recovery with a Conventional Probe", which appeared in *Journal of Magnetic Resonance*, Vol. 57, 1984, pp. 394–403, describes a circuit for noise-free antenna attenuation, as is desirable in the reception mode. An input impedance of a connected pre-amplifier is appropriately transformed at the signal terminal of the antenna so that it has an attenuating effect at this terminal.

SUMMARY OF THE INVENTION

An object of the present invention is to provide an antenna system with which signals of a number of individual antennas can be combined in order to form sensitivity distributions (magnetic field structures) that cannot be achieved with an individual antenna by itself. At the same time, an attenuation of the individual antennas should be possible on the basis of the input impedance of the pre-amplifier.

This object is achieved in an antenna system wherein the individual antennas are connected to a pre-amplifier via a combination circuit, with the combination circuit being fashioned such that signal contributions that can be emitted by the individual antennas exhibit a phase difference of 0° or 180° at the pre-amplifier. This passive interconnection of the individual antennas preceding the pre-amplifier allows the inherently known pre-amplifier decoupling of the individual antennas to be realized. The outlay for electronics remains low; nonetheless, the signal contributions of the individual antennas can be combined with differently weighted contributions.

DESCRIPTION OF THE DRAWINGS

FIG. 1 is a schematic circuit diagram of an antenna system with separate matching circuits and a 180° hybrid as combination circuit in accordance with the invention.

FIGS. 2A through 2D show schematic circuit diagrams for simplifying a short-circuited 180° hybrid to a port in accordance with the invention.

DESCRIPTION OF THE PREFERRED EMBODIMENTS

Figure 3:
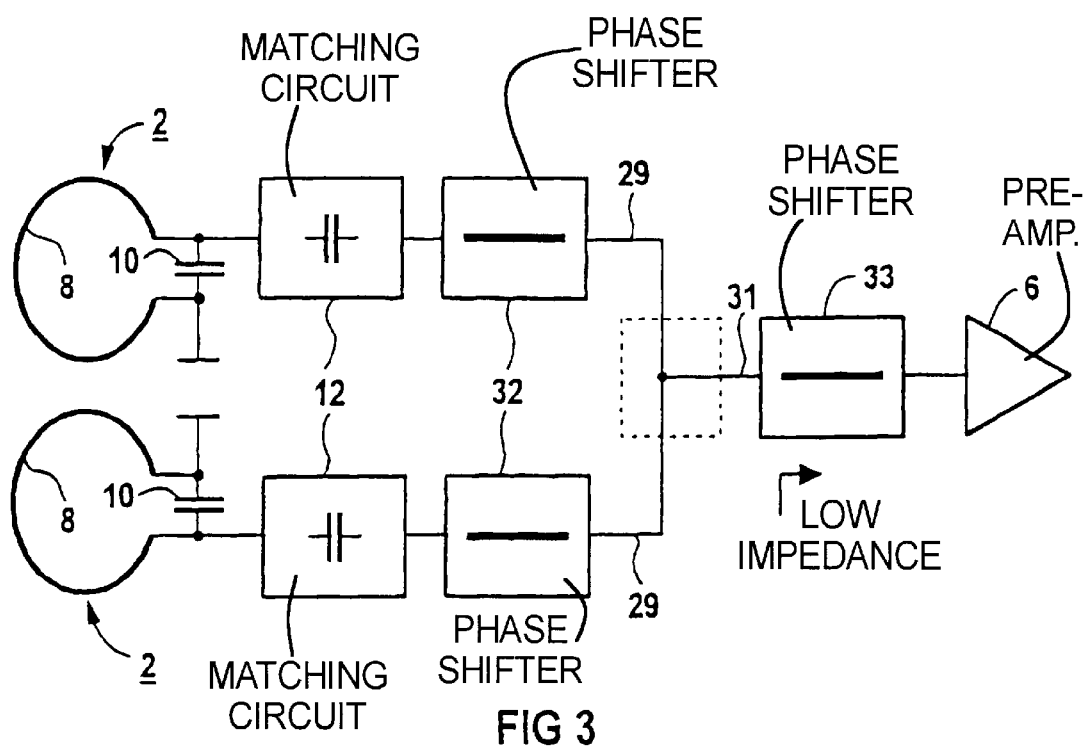
FIG. 3 is a schematic circuit diagram of a parallel circuit as an embodiment of a combination circuit short-circuited to a port in accordance with the invention.

The schematic circuit diagram of an antenna system shown in FIG. 1 shows two resonant individual antennas 2 that are connected to a pre-amplifier 6 via a combination circuit 4. The combination circuit 4 is fashioned such that signal contributions that can be output by the individual antennas 2 has a phase difference of 0° or 180° at the pre-amplifier 6. Each resonant individual antenna 2 has a conductor loop 8 and a resonance capacitor 10 across which the signal received by the individual antenna 2 can be taken. Matching circuits 12 match the impedance of the antennas 2 to the impedance of following transmission elements. The combination circuit is realized as a 180° hybrid with two input ports 14 and 16 and two output ports 18 and 20. The pre-amplifier 6 is connected to the port 18 via a phase-shifter circuit 22 (PhiVV), and an impedance 24 that simulates the input impedance of the pre-amplifier 6 is connected to the port 20.

A noise-free attenuation of the individual antennas 2 that is desired in the reception mode is realized by the pre-amplifier decoupling (as is known and was mentioned above) via the pre-amplifier input impedance together with the phase shifter 22 (PhiVV) preceding the pre-amplifier 6. The impedance 24 connected to the port 20 of the hybrid 4 has a reflection factor phase angle that is equal to the reflection factor phase angle at the port 18 (pre-amplifier input via phase shifter 22). When, for example, the reflection factor angle at the port 18 is arc(r3)=0° or 180°, thus, the impedance 24 at r4 must also represent a no-load state, i.e. a short. Both reflection factors at the output are combined via the hybrid 4 and appear at the inputs of a 180° hybrid as:

$$r1=r2=(r3+r4)/2, \text{ with } |r1|=|r2| \text{ close to } 1.$$

These are transformed via the matching circuits 12 such that both individual antennas 2 are highly attenuated. Thus produces the advantage that only one pre-amplifier 6 is present, but the active attenuation on the basis of the pre-amplifier input impedance is nonetheless possible. Moreover, the matching circuits 12 for the two individual antennas 2 can be somewhat differently dimensioned. As a result of this different dimensioning, a different weighting of the signals of the individual antennas 2 is achieved, a common field direction can, for example, be tilted, for example +−20°. Fundamentally, thus, asymmetrical shadowings caused by tissue eddy currents also can be compensated.

It should be noted that r1=(r3−r4)/2 and r2=(r4−r3)/2=−r1 would apply given a 90° hybrid (combiner for circular polarization) that is not the subject matter of the invention. Accordingly, r1 and r2 would be opposite, so that the possibility of pre-amplifier decoupling described herein would not be possible.

FIG. 2A shows a realization of a 180° hybrid with two transformers 26 and 28. Four ports 14, 16, 18 and 20 having the same impedance Zo, for example 50 Ohms, relative to ground are shown. FIG. 2B shows a realization of a 180° hybrid with only one transformer 30 and different reference impedances: Zo/2 at port 18 and 2Zo at the ground-free port 20. FIG. 2C shows the realization according to FIG. 2B but with a short-circuit connected to the port 20. In the schematic circuit shown in FIG. 2D, the transformer 30 according to FIG. 2C is shorted and therefore can be omitted.

An especially advantageous embodiment thus is achieved with arc(r4)=arc(r3)=180°, with the combination circuit 4 being composed of only one branching with two antenna branches 29 and a pre-amplifier branch 31, as shown in the schematic circuit diagram of FIG. 3. The minimal outlay and the absence of additional losses due to the combination circuit 4 are advantageous. Since, however, arc(r1)=arc(r2)= 180°, i.e. r1=r2 =approximately −1 (low impedance), is thus defined, two phase shifters 32 (Phi1) are generally still required preceding this realization of the combination circuit 4 in order to achieve a maximum attenuation by the preamplifier impedance. One phase shifter 33 (phi2) connects the input impedance of the pre-amplifier 6 to the preamplifier branch 31 in low-impedance fashion.

Figure 4:
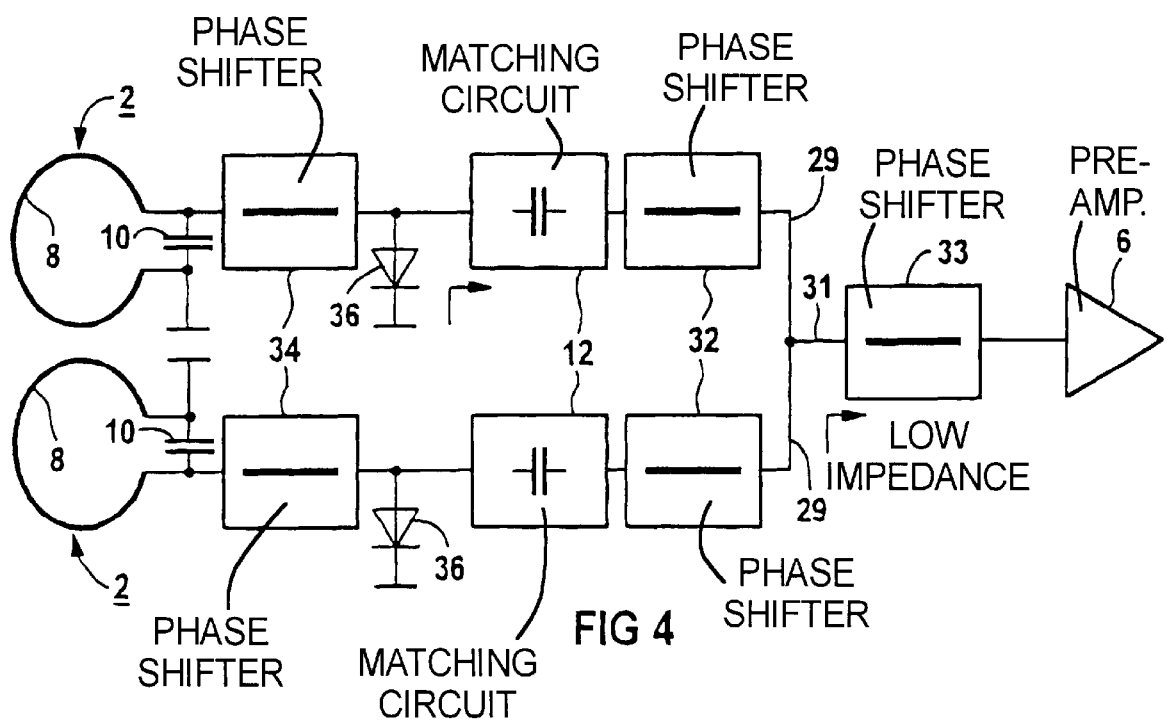
FIG. 4 is a schematic circuit diagram of an antenna system with an active decoupling circuit for a transmission field in accordance with the invention.

When the individual antennas 2 are supplied with a transmission current, they must be opened by suitable measures (switches) in the transmission mode. One possibility therefor is shown in FIG. 4, supplementing the circuit of FIG. 3. Phase shifters 34 (Phi0) are inserted between the matching circuits 12 and the individual antennas. Diode switches 36, for example in the form of PIN diodes, are connected to the junction of phase shifter 34 and matching circuit 12. The phase shifters 34 (Phi0) should effect an opening of the individual antennas 2 given a short of the output side.

Figure 5:
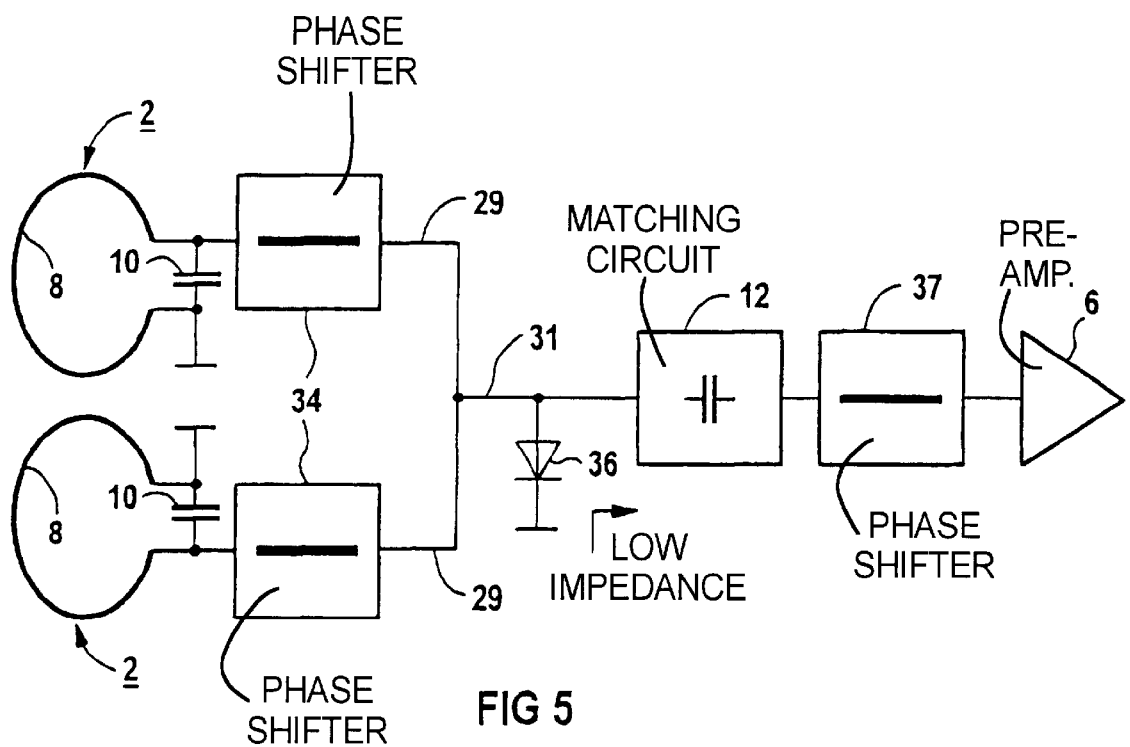
FIG. 5 is a schematic circuit diagram of an antenna system with a single active transmission field decoupling circuit for both individual antennas in accordance with the invention.

Since the simple branching combiner 4 of FIG. 3 should likewise have a low input impedance, it is possible to attach this directly following the PIN diodes 36. The two PIN diodes then can be combined to form a single diode switch 36, as shown in the schematic circuit diagram illustrated in FIG. 5. The matching circuit is then arranged following the branching point of the combination circuit 4. One phase shifter 37 (Phi3) is set such that the required low impedance is seen preceding the matching circuit 12. The phase shifter 37 (Phi3) shifts the phase of the sum signal in the same fashion as the two phase shifters 32 (Phi1) and 33 (Phi2) in the circuit of FIG. 4.

A variable weighting of the signals of the two individual antennas 2 in the antenna system is no longer possible without further measures on the basis of differently dimensioned matching circuits 12 in this version, however, a similar effect can be realized here with different geometrical sizes of the individual antennas 2. Decoupling and transparency for a uniform, vertical transmission field are also preserved by the separate phase shifters 34 (Phi0) preceding the PIN diode 36.

Figure 6:
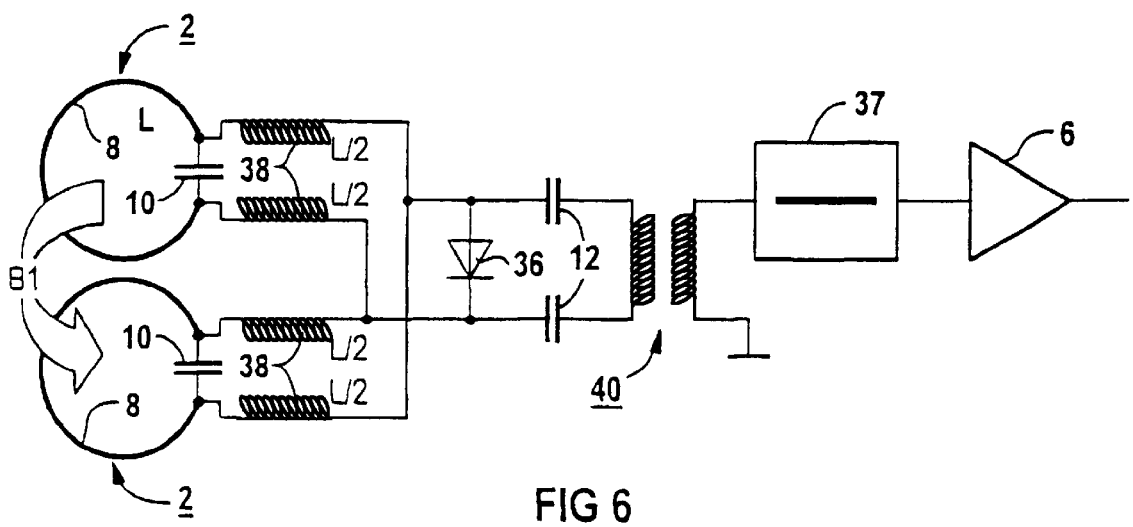
FIG. 6 is a block circuit diagram of an antenna system having symmetrical wiring of the individual antennas and a balun circuit following a matching circuit in accordance with the invention.

A series inductance or transmitter decoupling coil 38 is utilized for the phase shifter 34 (Phi0) in the exemplary embodiment of FIG. 6. This is a principle for transmission field decoupling that is known from the article by J. Tanttu, "Floating Surface Coil", published in the Conference Volume XIV ICMBE and VII ICMP, Espoo, Finland, 1985, p. 831. Here, the transmitter decoupling coils are symmetrically divided onto the two antenna terminals with half the antenna inductance L/2. A balun circuit 40 is provided following the symmetrical matching network 12. Otherwise, the circuit corresponds to the embodiment shown in FIG. 5. This antenna system has a sensitivity B1 like the known butterfly structure.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna system for receiving magnetic resonance signals comprising:
   at least two individual resonant antennas;
   a pre-amplifier; and
   a combination circuit connecting said individual resonant antennas to said pre-amplifier with respective signal contributions from each antenna, said combination circuit producing said signal contributions selectively with a fixed phase difference of 0° and 180°, respectively, to said pre-amplifier.

2. An antenna system as claimed in claim 1 wherein said pre-amplifier has an input stage containing a phase-shifter circuit.

3. An antenna system as claimed in claim 1 wherein said combination circuit comprises a 180° hybrid circuit.

4. An antenna system as claimed in claim 3 wherein said 180° hybrid circuit has an output, and further comprising a reactance connected at said output having a reflection factor angle which equals a reflection factor angle produced by said pre-amplifier.

5. An antenna system as claimed in claim 1 further comprising respective matching circuits connected between each of said individual resonant antennas and said combination circuit.

6. An antenna system as claimed in claim 1 wherein said combination circuit comprises antenna branches, respectively connected to said individual resonant antennas, proceeding from a branching point and a pre-amplifier branch, proceeding from said branching point, connected to said pre-amplifier, and further comprising respective phase shifters connected in each of said antenna branches, and wherein said pre-amplifier branch has a low impedance as seen from said branching point.

7. An antenna system as claimed in claim 6 wherein each of said antenna branches further includes a further phase shifter and a matching circuit connected between said phase shifter and said further phase shifter, and a high frequency switch connected between said matching circuit and said further phase shifter for actively detuning the individual resonant antenna connected to the antenna branch.

8. An antenna system as claimed in claim 1 wherein said combination circuit comprises antenna branches respectively connected to said individual resonant antennas, proceeding from a branching point, and a pre-amplifier branch proceeding from said branching point and connected to said pre-amplifier, and wherein each of said antenna branches contains a phase shifter and a high frequency switch for actively detuning the individual resonant antenna connected to the antenna branch, and wherein said pre-amplifier branch has a low impedance as seen from said branching point.

9. An antenna system as claimed in claim 8 further comprising a matching circuit and a further phase shifter connecting said pre-amplifier branch to said pre-amplifier.

10. An antenna system as claimed in claim 1 wherein said combination circuit comprises antenna branches respectively connected to said individual resonant antennas, proceeding from a branching point, and a pre-amplifier branch proceeding from said branching point, and wherein each of said antenna branches has a decoupling coil therein, and wherein said antenna system further comprises a balun circuit and a matching circuit connecting said balun circuit to said pre-amplifier branch, and a phase shifter connected between said balun circuit and said pre-amplifier.

* * * * *